US006674381B1

(12) United States Patent
Gomez et al.

(10) Patent No.: US 6,674,381 B1
(45) Date of Patent: Jan. 6, 2004

(54) METHODS AND APPARATUS FOR TONE REDUCTION IN SIGMA DELTA MODULATORS

(75) Inventors: Gabriel J. Gomez, Plano, TX (US); Baher S. Haroun, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/377,222

(22) Filed: Feb. 28, 2003

(51) Int. Cl.$^7$ ................................................ H03M 3/00
(52) U.S. Cl. ........................ 341/143; 341/144; 341/155
(58) Field of Search ................................. 341/143, 131, 341/144, 155

(56) References Cited

U.S. PATENT DOCUMENTS 4,399,426 A * 8/1983 Tan ............................. 341/120

OTHER PUBLICATIONS

"An Improved Technique for Reducing Baseband Tones in Sigma–Delta Modulators Employing Data Weighted Averaging Algorithm Without Adding Dither", IEEE Transactions on Circuits and Systems—II: Analog and Digital Signal Processing, Kuan–Dar Chen and Tai–Haur Kuo, vol. 46, No. 1, Jan., 1999, gs. 63–68.

* cited by examiner

*Primary Examiner*—Peguy JeanPierre
(74) *Attorney, Agent, or Firm*—Ronald O. Neerings; Wade James Brady, III; Frederick J. Telecky, Jr.

(57) ABSTRACT

Sigma delta modulators and digital to analog converters therefor are disclosed, in which intentional mismatch is provided in circuit elements of the digital to analog converter to facilitate tone reduction where dynamic element matching is used in selecting the digital to analog converter circuit elements. Methods are disclosed for fabricating digital to analog converters for providing analog feedback using a group of circuit elements selected according to a quantized output signal in a sigma delta modulator, in which a plurality of matched circuit elements having values within a tolerance amount of a design value are provided in the group along with at least one mismatched circuit element having a mismatched element value differing from the design value by a mismatch amount, where the mismatch amount is greater than the tolerance amount.

28 Claims, 7 Drawing Sheets

$C_i = C_{i\,ACTUAL} + C_iL$ $C1 = C1_{ACTUAL} + C1L + C1L'$

METHODS AND APPARATUS FOR TONE REDUCTION IN SIGMA DELTA MODULATORS

FIELD OF INVENTION

The present invention relates generally to integrated circuit devices and more particularly to sigma delta modulators, digital to analog converters, and fabrication methods therefore.

BACKGROUND OF THE INVENTION

Analog to digital (A/D) converters are electrical circuit devices that convert continuous signals, such as voltages or currents, from the analog domain to the digital domain, in which the signals are represented by numbers. A variety of A/D converter types exist, including flash A/Ds, sub-ranging A/Ds, successive approximation A/Ds, and integrating A/Ds. Another type of A/D converter is known as a delta sigma or sigma delta (e.g., S-D) A/D, which may sample an analog signal at a very high sampling rate (oversampling) in order to perform a noise shaping function. The oversampling is commonly performed at a multiple of the Nyquist rate (Fs) for a given input signal frequency content (e.g., oversampling at 10 to 1000 times Fs), wherein quantization noise power is spread over a bandwidth equal to the sampling frequency. Digital filtering is then employed on the digital output to achieve a high resolution. Decimation may then be employed to reduce the effective sampling rate back to the "Nyquist" rate.

Sigma delta A/D converters are noise shaping modulators and may be first order, second order, or jth order, where j is a positive integer. For example, a typical first order sigma delta modulator comprises a filter, such as an integrator circuit, which receives the analog input signal as well as a feedback signal, and a quantizer, such as a flash AND converter, which quantizes the filter output signal to create a digital output. In the simplest form, the quantizer may be a single bit A/D, such as a comparator circuit. A digital to analog (D/A) converter creates an analog representation of the current digital output and provides this as the feedback signal to the filter. Multiple order sigma delta modulators may include a series of n filters in the forward path, each filtering the output of the previous filter and receiving an analog feedback signal based on the digitized output of the modulator, where the first filter operates on the input signal to be converted and the feedback signal.

Multi-bit or multi-level sigma delta modulators provide multi-bit digital or quantized outputs, wherein the analog to digital converter thereof is multi-bit. For example, a multi-level flash or other type A/D circuit may receive the output of the final filter and provide a multi-bit digital output representative thereof, wherein the D/A feedback converter is accordingly multi-bit as well. Whereas single-bit sigma delta modulators can achieve good linearity, performance and stability are generally not as good as in multi-bit sigma delta modulators. On the other hand, the harmonic distortion of the sigma delta modulator suffers as more bits are used in the quantizer and D/A circuits. In this regard, the linearity of the multi-bit system is essentially limited by the linearity of the D/A converter, particularly nonlinearity due to mismatch of D/A internal components.

One approach to reducing the adverse effects of D/A component mismatch in multi-bit sigma delta modulators is the use of dynamic element matching (DEM) techniques in the feedback. For instance, DEM systems may be employed in the modulator feedback path to vary the selection of mismatched components in the D/A converter in response to the quantized digital output signal. Such DEM techniques have been employed successfully to reduce the linearity problems in multi-bit sigma delta modulators.

Another performance measure in sigma delta modulators is the production of unintended tone components in the output, sometimes referred to as idle channel tones. This problem is particularly troublesome for static (e.g., DC) or slowly changing input signals, wherein the modulator creates a repetitive pattern, which appears as a tonal component in the output spectrum. To combat this phenomenon, a dither signal is sometimes applied to the input of the quantizer A/D in the modulator, as illustrated in U.S. Pat. No. 6,326,911, assigned to the assignee of the current invention. With respect to idle channel tones, the randomizing effect of certain DEM systems and algorithms may operate to reduce or reject the unwanted tones. However, conventional sigma delta modulators with dynamic element matching for selection of D/A converter components do not provide complete or significant rejection of tones in the case of very slow or DC input signals. Thus, there is a need for improved sigma delta modulators, digital to analog converters, and fabrication methods therefor, by which the undesired tonal components may be reduced in such multi-bit sigma delta modulators.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The invention relates to sigma delta modulators, digital to analog (D/A) converters, and fabrication methods therefore, by which the undesired tonal components may be mitigated in multi-bit sigma delta modulators employing dynamic element matching, through provision of intentional component mismatch in feedback D/A converters.

In one aspect of the invention, a sigma delta modulator is provided, comprising a filter, a quantizer, a digital to analog converter, and a dynamic element matching (DEM) system. The filter receives an input signal and an analog feedback signal, and provides a filtered output signal. The quantizer receives the filtered output signal and provides a quantized output signal according to the filtered output signal, wherein the quantized output signal corresponds to the input signal. The D/A converter comprises a plurality of circuit elements, individually having an associated element value, where the D/A converter provides the analog feedback signal corresponding to the quantized output signal using circuit elements selected according to the quantized output signal.

The plurality of D/A circuit elements comprise one or more mismatched components or circuit elements as well as a plurality of matched circuit elements, which may be capacitors, resistors, transistors, or any type of component or groups thereof. The mismatched circuit element has a mismatched element value, differing from a design element value by a mismatch amount, and the matched circuit elements have element values within a tolerance amount of the design element value, where the mismatch amount is greater than the tolerance amount. The element values may be any value affecting D/A conversion, such as capacitance, resistance, transistor size, gain, etc. The DEM system operates to vary the selection of circuit elements of the digital to analog converter. The employment of the mismatched circuit element provides or ensures some amount of D/A component mismatch across matching tolerance variation in the manufacture of large numbers of semiconductor devices. As a result, most if not all such manufactured parts will have enough D/A circuit element mismatch to allow the DEM system to reduce or mitigate unwanted idle channel tones in the sigma delta modulator.

Another aspect of the invention provides a D/A converter for providing an analog feedback signal corresponding to a quantized output signal in a sigma delta modulator. The D/A comprises a plurality of circuit elements, individually having an associated element value, where the plurality of circuit elements comprises at least one mismatched circuit element having a mismatched element value differing from a design element value by a mismatch amount, and a plurality of matched circuit elements having element values within a tolerance amount of the design element value, and where the mismatch amount is greater than the tolerance amount.

Yet another aspect of the invention provides a method of fabricating a digital to analog converter for providing an analog feedback signal corresponding to a quantized output signal using a group of circuit elements selected according to the quantized output signal in a sigma delta modulator. The method comprises providing a plurality of matched circuit elements in the group, where the matched circuit elements have element values within a tolerance amount of a design element value. The method further comprises providing at least one mismatched circuit element in the group, which has a mismatched element value differing from the design element value by a mismatch amount, with the mismatch amount being greater than the tolerance amount.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
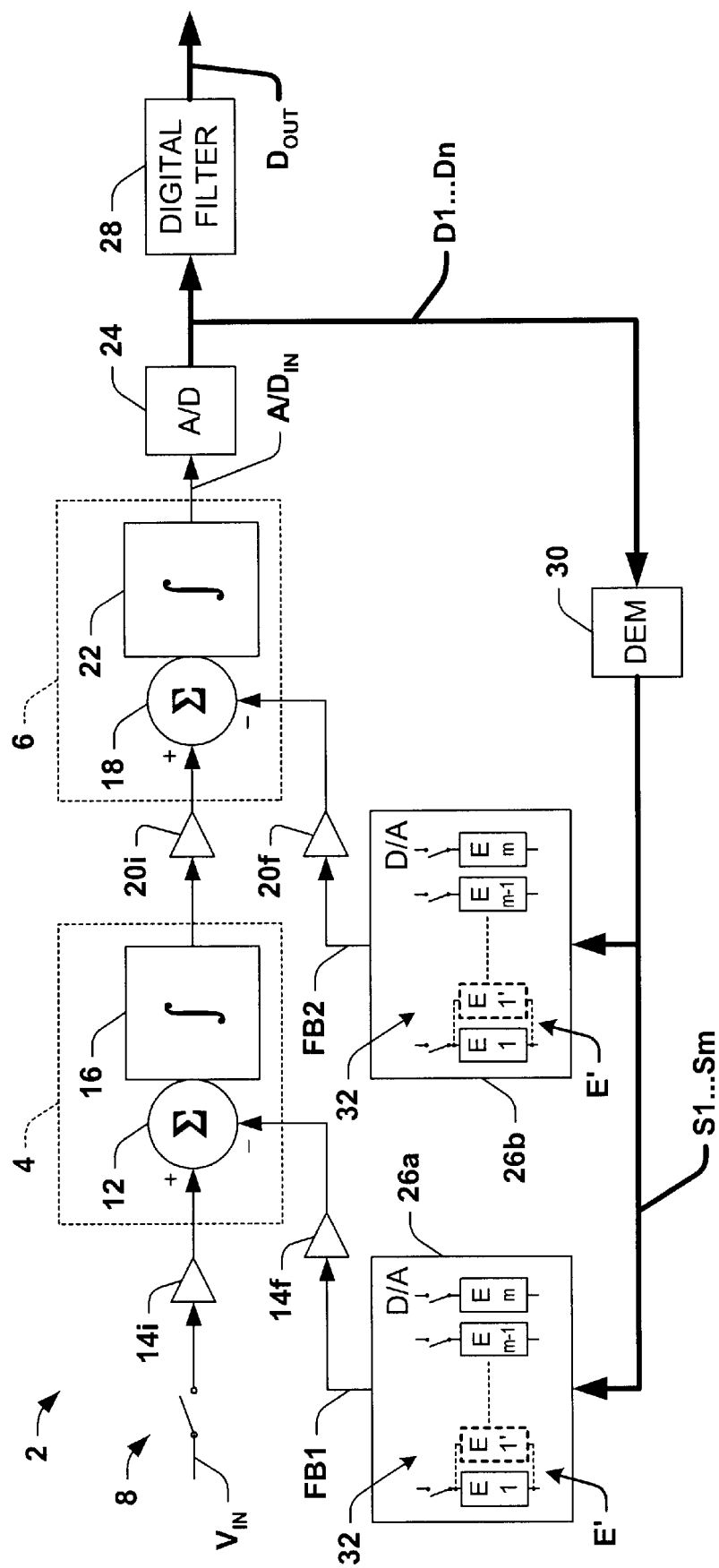
FIG. 1 is a schematic diagram illustrating an exemplary second order multi-bit sigma delta modulator having D/A converters employing component mismatching in accordance with one or more aspects of the present invention.

One or more exemplary implementations of the present invention will now be described with reference to the attached drawings, wherein like reference numerals are used to refer to like elements throughout. The invention relates to sigma delta modulators and digital to analog converters therefore, in which intentional mismatch is provided in one or more circuit elements of a digital to analog (D/A) converter to facilitate tone reduction where dynamic element matching is used in selecting the digital to analog converter circuit elements. The invention is illustrated and described hereinafter in the context of an exemplary second order three-bit sigma delta modulator. However, the invention may be carried out in multi-bit sigma delta modulators of any order, including single order and jth order, where j is a positive integer. Moreover, the invention is illustrated in conjunction with exemplary switched capacitor type D/A converters, although the invention is not limited to capacitive type D/As.

The inventors have appreciated that due to the nature of manufacturing processes and the statistical nature of variations thereof, some manufactured modulator components may, and often do, include D/A converters with perfectly or very closely matched internal components, such as switched capacitors, resistive elements, current source circuits, or other D/A circuit elements. In this regard, D/A component matching is believed to be a probabilistic function related to a particular manufacturing process. The inventors have further appreciated that whereas DEM algorithms and systems in conventional sigma delta modulators may operate to mitigate unwanted tones in the presence of component mismatch in multi-bit feedback D/A converters, such dynamic element matching fails to reduce, and may even contribute to tonal problems where the D/A circuit elements are closely or perfectly matched. This situation may adversely affect process yield, wherein semiconductor devices having multi-bit sigma delta modulators employing DEM systems are rejected for tonal reasons related to very close or perfect matching of D/A components.

In this regard, the invention provides for intentional mismatching of one or more D/A circuit elements in such a way that most fabricated chips have enough D/A component mismatch to dither or reduce tones. The invention provides techniques and apparatus for facilitating tone dithering in sigma delta modulators, which may be implemented using circuit design and/or layout techniques having minimal or no adverse impact on area overhead, and which may advantageously improve manufacturing yield by ensuring that most if not all fabricated modulators include D/A converters with at least some component mismatch.

Figure 2:
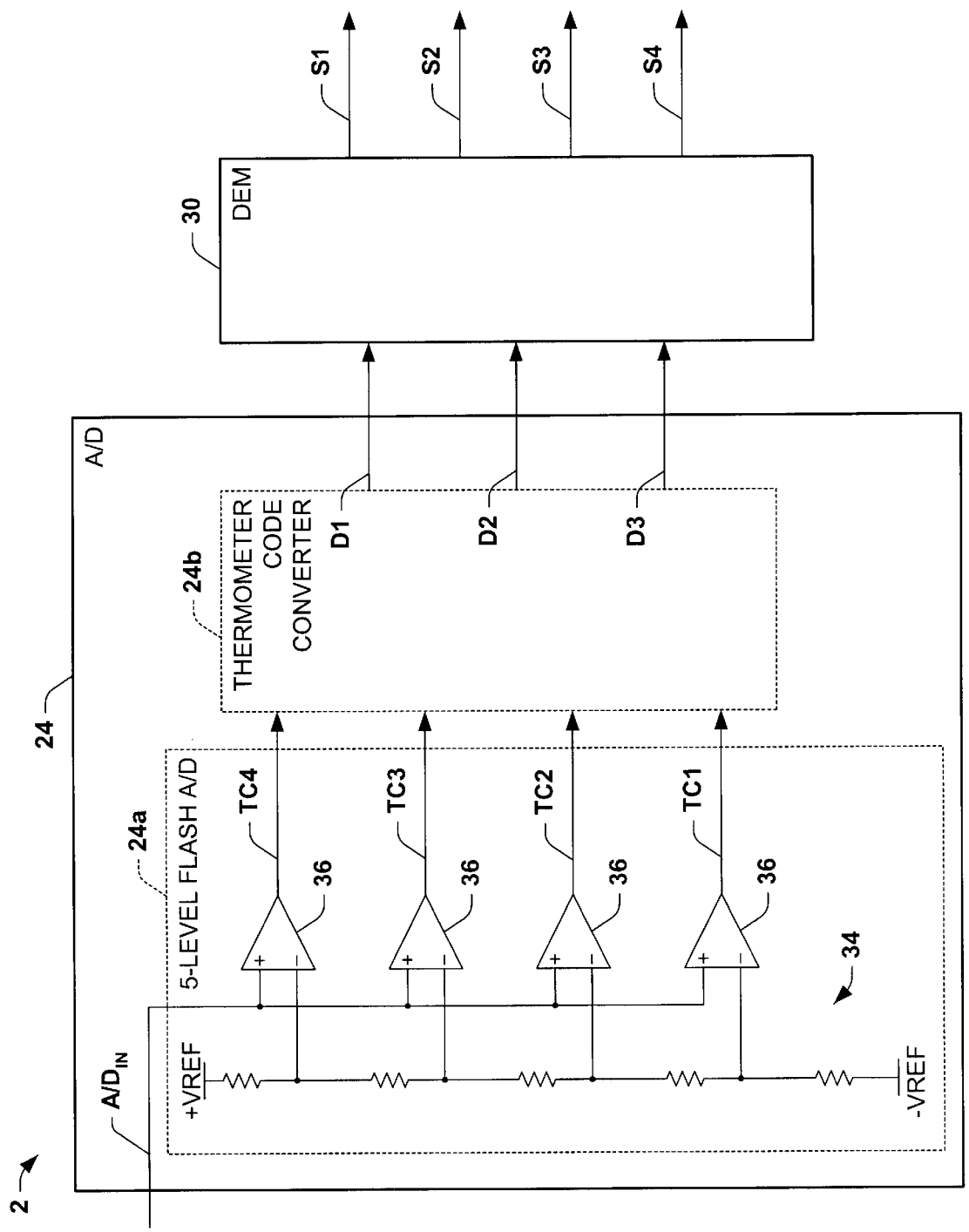
FIG. 2 is a schematic diagram illustrating further details of an exemplary multi-level A/D converter and dynamic element matching system in the exemplary modulator of FIG. 1.
Figure 3:
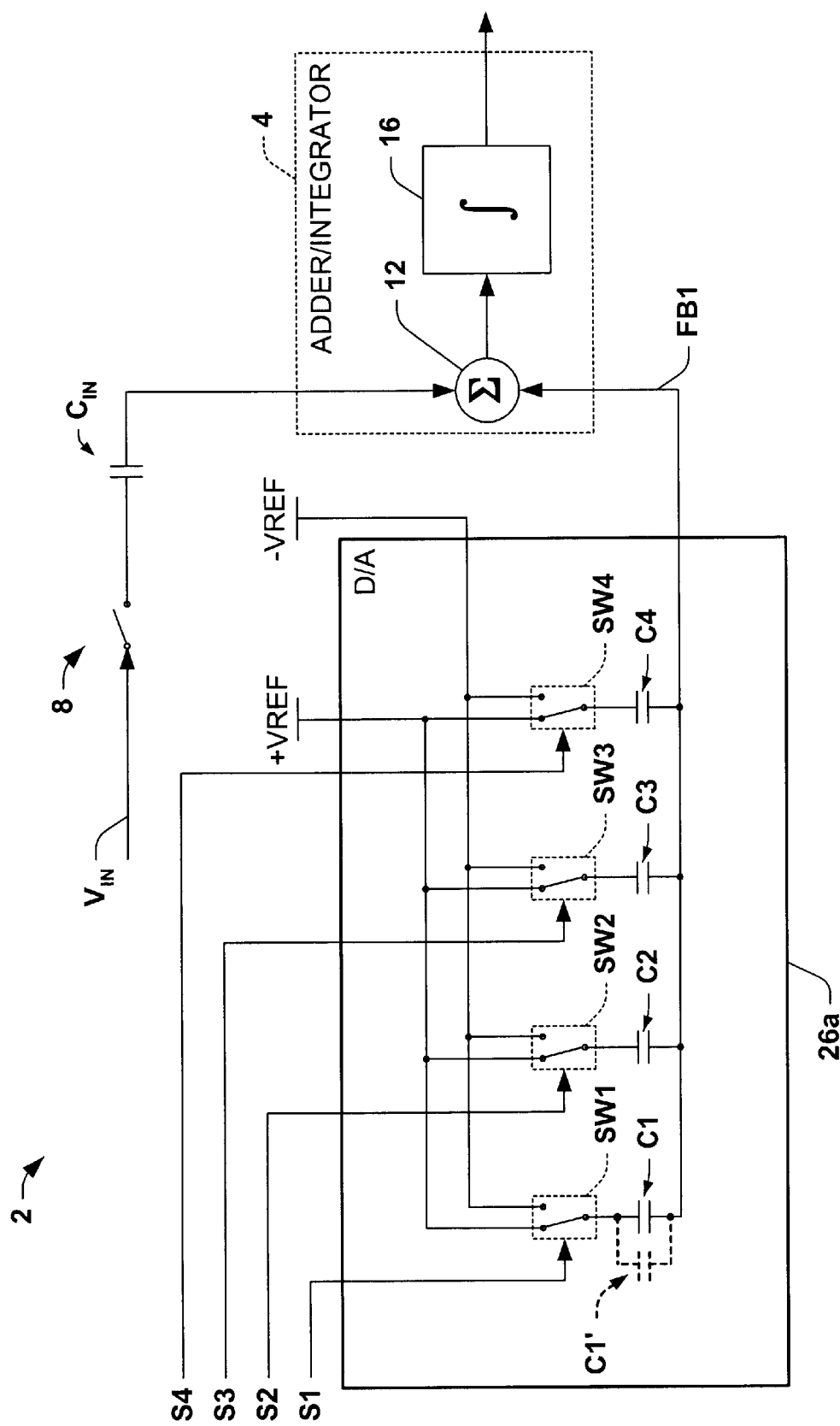
FIG. 3 is a schematic diagram illustrating further details of one of the D/A converters with component mismatching in the exemplary modulator of FIG. 1.

An exemplary second order sigma delta modulator 2 is illustrated in FIGS. 1–3 in accordance with the present invention. The modulator 2 comprises first and second adder/integrators 4 and 6, respectively, wherein the first adder/integrator 4 comprises a first summing junction 12 and a first filter 16, wherein the filter 16 in this example is a switched capacitor integrator circuit. The summing junction 12 receives an analog input signal $V_{IN}$ via an input gain stage 14$i$ and a feedback signal FB1 via a feedback gain stage 14$f$ from a first D/A converter 26$a$, as described further below. The summing junction 12 provides an error signal (e.g., the difference between the input and feedback signals according to the relative gains 14$i$ and 14$f$) to the input of the first filter 16. The modulator 2 may be a continuous time modulator or the input signal $V_{IN}$ may be periodically sampled via a switching element 8. The integrator filter 16 provides a filtered output through a second input gain stage 20$i$ to a second summing junction 18 of the second adder/integrator 6, which also receives a second feedback signal FB2 via a second feedback gain stage 20$f$ from a second D/A converter 26$b$ generally similar to the first D/A converter 26$a$.

The second summing junction 18 provides an error signal (e.g., the difference between the filtered output signal from the first filter 16 and the second feedback signal FB2 according to the relative gains 20$i$ and 20$f$) to the input of a second integrator filter 22 in the second adder/integrator 6. The modulator 2 further comprises an analog to digital (A/D) converter or quantizer 24 receiving the resultant signal A/D$_{IN}$ from the second filter 22. The A/D converter 24 generates an n-bit quantized or digital output signal D1 . . . Dn, where n is a positive integer. In the illustrated example, the quantizer 24 is a 5-level flash A/D converter generating a 3 bit digital output (e.g., n =3 in the illustrated example), although any multi-bit A/D converter or quantifier may be used in accordance with the invention.

The D/A converters 26$a$ and 26$b$ provide the analog feedback signals FB1 ad FB2, respectively, in accordance with the digital output D1 . . . Dn of the A/D converter 24 via a dynamic element matching (DEM) system 30. The DEM system 30 receives the digital output signal D1 . . . Dn and provides switching selection signals S1 . . . Sm in accordance with the digital output D1 . . . Dn and a DEM algorithm, wherein m is a positive integer (e.g., m=4 in the illustrated example). A digital decimation filter 28 reduces undesirable noise in the quantized digital output signal D1 . . . Dn. The digital filter 28 acts as an anti-aliasing filter with respect to the final sampling rate and filters out higher frequency noise produced by the noise shaping process of the modulator 2. Final data reduction is performed by digitally resampling the filtered output at a lower rate using a process called decimation in the filter 28, wherein decimation removes redundant signal information introduced by the oversampling process.

In operation of the exemplary sigma delta modulator 2, the filter 16 receives the difference between the input signal $V_{IN}$ and the first feedback signal FB1, and provides a first filtered output signal in accordance therewith. This first filtered signal is provided to the summing junction 18 along with the second feedback signal FB2, and the difference there between is provided as an error signal input to the second filter 22. The second filter 22 provides a second filtered signal A/D$_{IN}$ to the quantizer or A/D 24, which provides the quantized (e.g., digital) output signal D1 . . . Dn corresponding to the input signal $V_{IN}$. The D/A converters 26$a$ and 26$b$ individually comprise a group or plurality 32 of circuit elements E having an associated element value, wherein the D/A converters 26$a$ and 26$b$ provide the analog feedback signals FB1 and FB2, respectively, corresponding to the quantized output signal D1 . . . Dn using circuit elements E selected according to the quantized output signal D1 . . . Dn. The DEM system 30 is coupled with the D/A converters 26$a$ and 26$b$ and with the quantizer 24 and operates to vary the selection of circuit elements E of the D/A converters 26$a$ and 26$b$ by generating switching selection signals S1 . . . Sm.

In accordance with one or more aspects of the present invention, the plurality 32 of circuit elements E in one or both of the D/A converters 26 comprises at least one mismatched circuit element E' having a mismatched element value differing from a design element value by a mismatch amount, and a plurality of matched circuit elements E having element values within a tolerance amount of the design element value, where the mismatch amount is greater than the tolerance amount. In the illustrated D/A converters 26$a$ and 26$b$, the tolerance amount is proportional to a standard deviation for the design element value, such as about one standard deviation, where the mismatch amount is about three or more times the tolerance amount. The statistical variation in the circuit element value from the design value has been generally found to be quantified according to a Gaussian or normal distribution, in which approximately 68% of the element values are within one standard deviation of the mean design value, 95% are within two standard deviations, and 99.7% are within three standard deviations. Accordingly, in this example, the invention provides for mismatch in about 99.7% of the manufactured devices, thereby ensuring acceptable yield with parts in which the DEM system operates to reduce unwanted tones. Alternatively, any tolerance amount and mismatch amount may be selected in accordance with the invention, wherein the mismatch amount is greater than the tolerance amount.

The filters 16 and 22 and the quantizer 24 may be of any form suitable for use in constructing sigma delta modulators, for example, such as switched capacitor integrator filters 16, 22 and a multi-level (e.g., multi-bit) flash or other type A/D converter 24, respectively. FIG. 2 illustrates further details of the exemplary quantizer 24 in the modulator 2, wherein the quantizer 24 comprises a 5-level flash A/D converter 24$a$ receiving the analog output signal A/D$_{IN}$ from the second filter 22, and providing thermometer coded output signals TC1–TC4 corresponding to the A/D$_{IN}$ signal using a resistive divider network 34 and comparators circuits 36. In this example, signals TC1–TC4 provide a thermometer code representation of five levels between a negative reference voltage −VREF and a positive reference voltage +VREF, including 0000, 0001, 0011, 0111, and 1111. The thermometer coded signals TC1–TC4 are provided to a thermometer code converter 24$b$ in the quantizer 24, which provides the quantized digital output signals D1, D2, and D3 to the digital filter 28 and to the DEM system 30. Alternatively, any suitable A/D converter may be employed to receive the filtered output of the final filter or integrator in the modulator forward path, which provides a multi-bit digital output signal representative of the input signal $V_{IN}$. Further, the conversion of the thermometer code to the digital output may alternatively be performed in the DEM system 30.

Although the exemplary sigma delta modulator 2 is a second order design, the invention is applicable to sigma delta modulators of any order and D/A converters therefor, wherein the modulator may be of any order, such as first order, second order, or jth order, where j is a positive integer. An exemplary first order modulator may be constructed, for example, wherein the filtered output of the first filter 16 is provided to the A/D converter 24 as an input A/D$_{IN}$, and wherein the items 6, 18, 20$i$, 20$f$, 22, and 26$b$ are omitted in FIG. 1. In general, multiple order modulators in accordance with the invention may comprise a plurality of filters serially coupled between the input signal V$_{IN}$ and the quantizer 24, and a plurality of D/A converters 26, with individual D/As 26 being coupled with the quantizer 24, the DEM system 30, and a corresponding one of the plurality of filters. Alternatively, a single D/A converter 26 employing the mismatch features of the invention may provide multiple feedback signals in a multiple order sigma delta modulator. Component mismatching may accordingly be provided in one, some, or all of the D/A converters 26 in a multiple order implementation of sigma delta modulator in accordance with this aspect of the invention. Moreover, the invention may be implemented in association with any suitable DEM system 30 and algorithm, including but not limited to individual level averaging (ILA), group level averaging (GLA), and partial data weighted averaging (partial DWA).

In the D/A converters 26, the circuit elements E may be any form of component used in creation of the feedback analog signal FB1 through component selection. For example, the circuit elements of the present invention may comprise capacitors, resistive elements, current source circuits, or other D/A circuit elements, including single components or groups of components. The element values, moreover, may be any value affecting D/A conversion, such as capacitance, resistance, transistor size, gain, etc. The mismatched element E', moreover, may be created in any manner, such as designing one of the elements E to be of different value than the matched components, or through addition of intentional mismatch elements or components, such as by routing connection structures of a mismatch capacitor close to one another, so as to create a parallel mismatch capacitance, thus effectively increasing the value of one of the circuit elements without adversely impacting area overhead.

FIG. 3 illustrates an exemplary implementation of the first D/A converter 26$a$ providing the feedback signal FB1 to the first adder/integrator 4. The exemplary D/A converter 26$a$ is a switched capacitor converter, wherein the circuit elements E are capacitors C1–C4, which comprises switching elements SW1–SW4 for selectively coupling the capacitors C1–C4 with a positive reference voltage +VREF or a negative reference voltage −VREF according to the switching selection signals S1 . . . Sm from the DEM system 30. In the exemplary D/A converter 26$a$, the capacitor elements C1–C4 are of similar values, such as having the same design capacitance value, wherein the individual capacitances may vary within a tolerance amount of the design capacitance value. The D/A converter 26$a$ is illustrated comprising a group or plurality of matched capacitor elements C2–C4 having capacitance element values within a tolerance amount of a design element value, as well as a mismatched capacitor element comprising capacitor C1 and a parallel mismatch capacitance C1'. As illustrated further in FIGS. 5A and 5B, below, the exemplary mismatched circuit element C1/C1' includes a capacitor C1 generally similar in value to the matched capacitors C2–C4, as well as a parallel mismatch capacitance C1' having a capacitance value generally equal to a mismatch amount, which is greater than the tolerance amount of the matched capacitors C2–C4.

Thus, the mismatched circuit element C1/C1' has a mismatched element value differing from the design element value by the mismatch amount in the exemplary D/A converter 26$a$. Alternative implementations are possible, for example, wherein elements are not of the same design value, such as weighted designs in which the values of the elements are designed to be multiples of one another. For instance, alternative designs are possible within the scope of the invention in which the design value of C2 is twice that of C1, C3 is designed to be four times the value of C1, C4 is designed to be eight times the value of C1, etc. Moreover, in the exemplary second order modulator 2, the first and second D/A converters 26$a$ and 26$b$ are generally similar, although other implementations are possible within the scope of the invention, having different D/A converters, one or more of which having at least one mismatched circuit element.

In the exemplary D/A converter 26$a$, the analog feedback signal FB1 is generated through selective charging of the capacitors C1–C4 according to the switching selection signals S1 . . . Sm, wherein the switching elements SW1–SW4 may be any suitable type of switch, such as transistors. The switching elements selectively couple the capacitors C1–C4 with one of the supply voltages −VREF or +VREF so as to provide the analog feedback signal FB1 generally corresponding to the digital output D1 . . . Dn. The charge on these capacitances is then summed at the summing junction 12 with the charge corresponding to the sampled input voltage V$_{IN}$, wherein the relative input and feedback gains (e.g., gain stages 14$i$ and 14$f$ in FIG. 1) are established in the present example according to the relative values of an input capacitance C$_{IN}$ and the D/A capacitances C1–C4. The resulting charge is an error signal and is then provided to the integrator filter 16.

In the illustrated example, the feedback signal FB1 is inverted by action of the switching signals S1–S4, so as to achieve negative feedback in the modulator 2. Where the A/D input value A/D$_{IN}$ is a full scale positive voltage (e.g., the quantized digital output D1 . . . Dn represents a full scale positive voltage), for example, the switching signals S1–S4 cause all four D/A capacitors C1-C4 to be coupled with −VREF, whereby a negative full scale feedback signal FB1 is created. Where the digital output represents zero volts (e.g., midway between −VREF and +VREF), the switching signals S1 . . . Sm provide for coupling two of the capacitors C1–C4 with −VREF and the remaining two capacitors with +VREF. For a full scale negative voltage, the switching signals S1–S4 cause all four D/A capacitors C1–C4 to be coupled with +VREF, whereby a positive full scale feedback signal FB1 is created. In this regard, the DEM system 30 provides for variation, whether random and/or algorithmic, of the selection of the capacitors C1–C4, such that the same capacitors are not necessarily switching in the same fashion for two occurrences of the same digital output value.

Figure 4B:
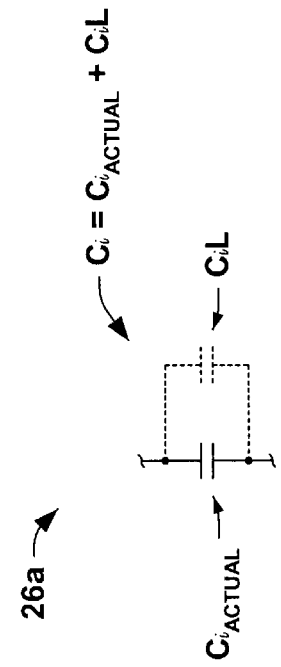
FIG. 4B is a schematic diagram illustrating the matched capacitor element of FIG. 4A comprising a capacitor structure with an actual capacitance value and a parallel capacitor resulting from routing of the conductive routing structures.
Figure 4A:
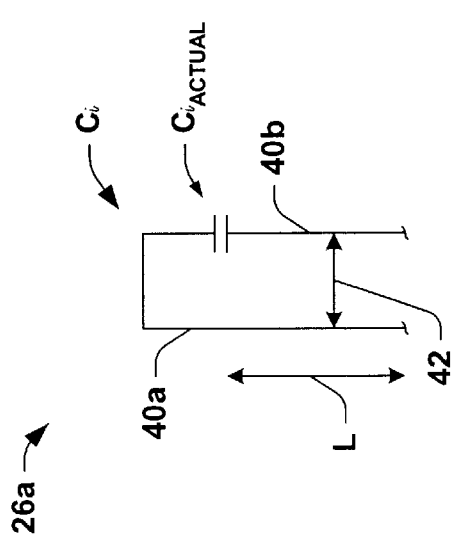
FIG. 4A is a schematic diagram illustrating an exemplary matched capacitor element with conductive routing structures in the exemplary D/A converter of FIGS. 1 and 3.

Referring now to FIGS. 4A–5B, an exemplary matched circuit element Ci in the D/A converter 26$a$ is illustrated in FIGS. 4A and 4B, comprising a capacitor Ci$_{ACTUAL}$ having first and second conductive routing structures 40$a$ and 40$b$ for electrically coupling the capacitor Ci$_{ACTUAL}$ with other components in the D/A converter 26$a$, wherein the routing structures 40$a$ and 40$b$ may be formed in one or more layers of a multi-layer semiconductor device. For example, the routing structures 40$a$ and 40$b$ may comprise metal or doped polysilicon formed in trenches and/or vias of interconnect layers fabricated during semiconductor manufacturing. Where the values of the individual capacitors C2–C4 are to be matched, the routing structures of the matched capacitor elements C2–C4 are generally of the same length L and spacing 42 (FIG. 4A), wherein the values of the matched elements C2–C4 are approximately Ci=Ci$_{ACTUAL}$+CiL, where the routing of the structures 40a and 40b along the length L creates a small parallel capacitance CiL depending upon a routing spacing 42 in the device layout or routing design. In operation, the spacing 42 is relatively large such that the parallel capacitance CiL in the match elements C2–C4 is small compared to the design capacitance value, wherein the values of the elements C2–C4 (e.g., $Ci_{ACTUAL}$+ CiL) is within a tolerance amount of the design value. In this regard, the tolerance amount may be dependent upon the manufacturing process flow employed in fabricating integrated circuits which include the modulator 2, and/or upon a particular fabrication facility or fabrication equipment used in making the devices.

Figure 5B:
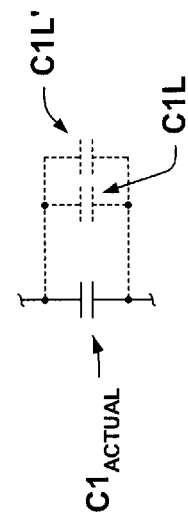
FIG. 5B is a schematic diagram illustrating the mismatched capacitor element of FIG. 5A comprising a capacitor structure with an actual capacitance value and an additional parallel mismatch capacitance resulting from the close routing of the conductive routing structures.
Figure 5A:
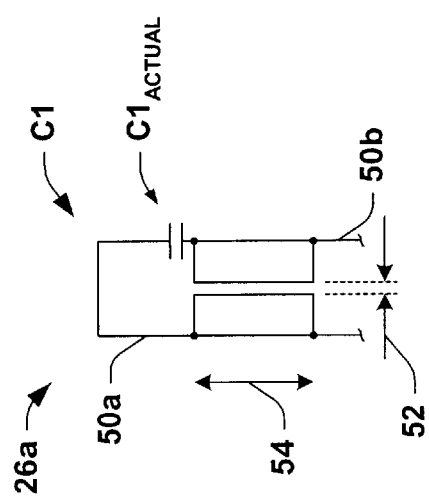
FIG. 5A is a schematic diagram illustrating an exemplary mismatched capacitor element in the exemplary D/A converter of FIGS. 1 and 3 with conductive routing structures routed close to one another.

As illustrated in FIGS. 5A and 5B, the mismatched component C1 also comprises a capacitor $C1_{ACTUAL}$ having first and second conductive routing structures 50a and 50b for electrically coupling the capacitor $C1_{ACTUAL}$ with other components in the digital to analog converter 26a, also formed in one or more layers of the semiconductor device (e.g., metal or doped polysilicon formed in trenches and/or vias of interconnect layers). The routing of the structures 50a and 50b create a small parallel capacitance C1L, similar to the parallel capacitance CiL in the matched capacitors C2–C4. The routing structures 50a and 50b of the mismatched circuit element C1, however, are routed close to one another, being spaced by a small distance 52 (FIG. 5A) for at least a length 54. This provides a fairly large mismatch capacitance C1L' in parallel with the actual capacitor $C1_{ACTUAL}$ and the small parallel capacitance C1L. The mismatch capacitance C1L is formed to provide a value of about the mismatch amount or more, for example, by suitable routing techniques in forming the structures 50a and 50b in the modulator 2.

In this manner, the mismatched element C1 has a capacitance value C1=$C1_{ACTUAL}$+C1L+C1L', which differs from the design value by the mismatch amount. In the exemplary D/A converter 20a, the mismatched circuit element C1 thus comprises a first circuit element $C1_{ACTUAL}$ having an element value within the tolerance amount of the design element value and a second circuit element C1L' having a value of about the mismatch amount or more. Other techniques may be used to create one or more mismatched circuit elements in a D/A converter in accordance with the invention. For example, a design value may be used for the mismatched element C1 which is different than that employed for the matched elements C2–C4. It is noted, however, that the exemplary implementation provides for matched values within a tolerance amount of the design value and a mismatched value differing therefrom by a mismatch amount or more, where little or no adverse impact is seen with respect to area overhead in the device. Further, the illustrated technique is relatively easy to implement, potentially requiring only slight modification to the routing of the structures 50a and 50b for the mismatched element C1. Similar techniques may also be employed for other forms or types of D/A circuit elements.

Figure 6:
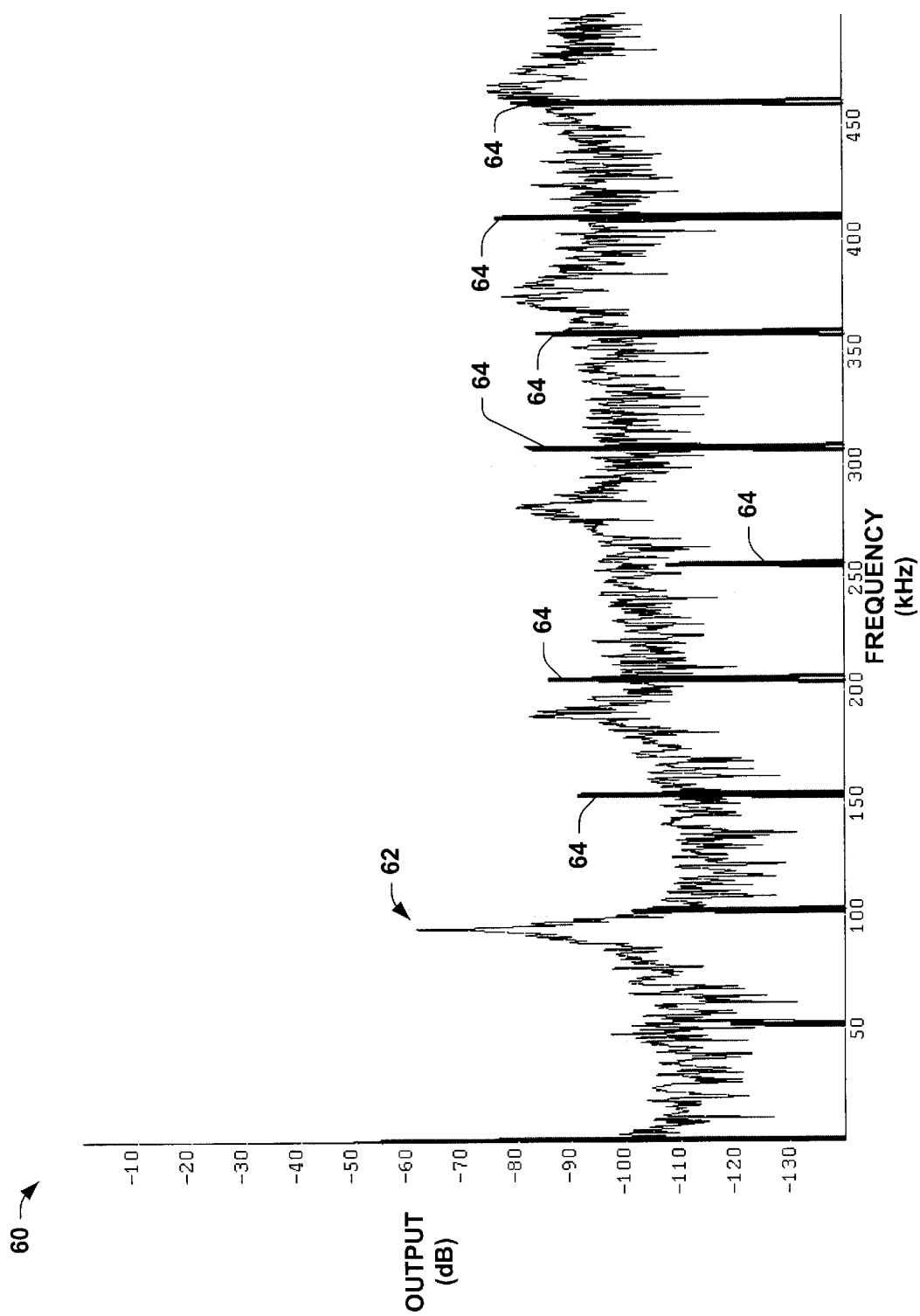
FIG. 6 is a plot illustrating simulation results obtained with no intentional mismatching with an ILA type DEM algorithm and with a mismatch amount of 0.5% with no DEM algorithm, using a tolerance amount of about 0.1% for a second order sigma delta modulator having 4-element D/A converters.
Figure 7:
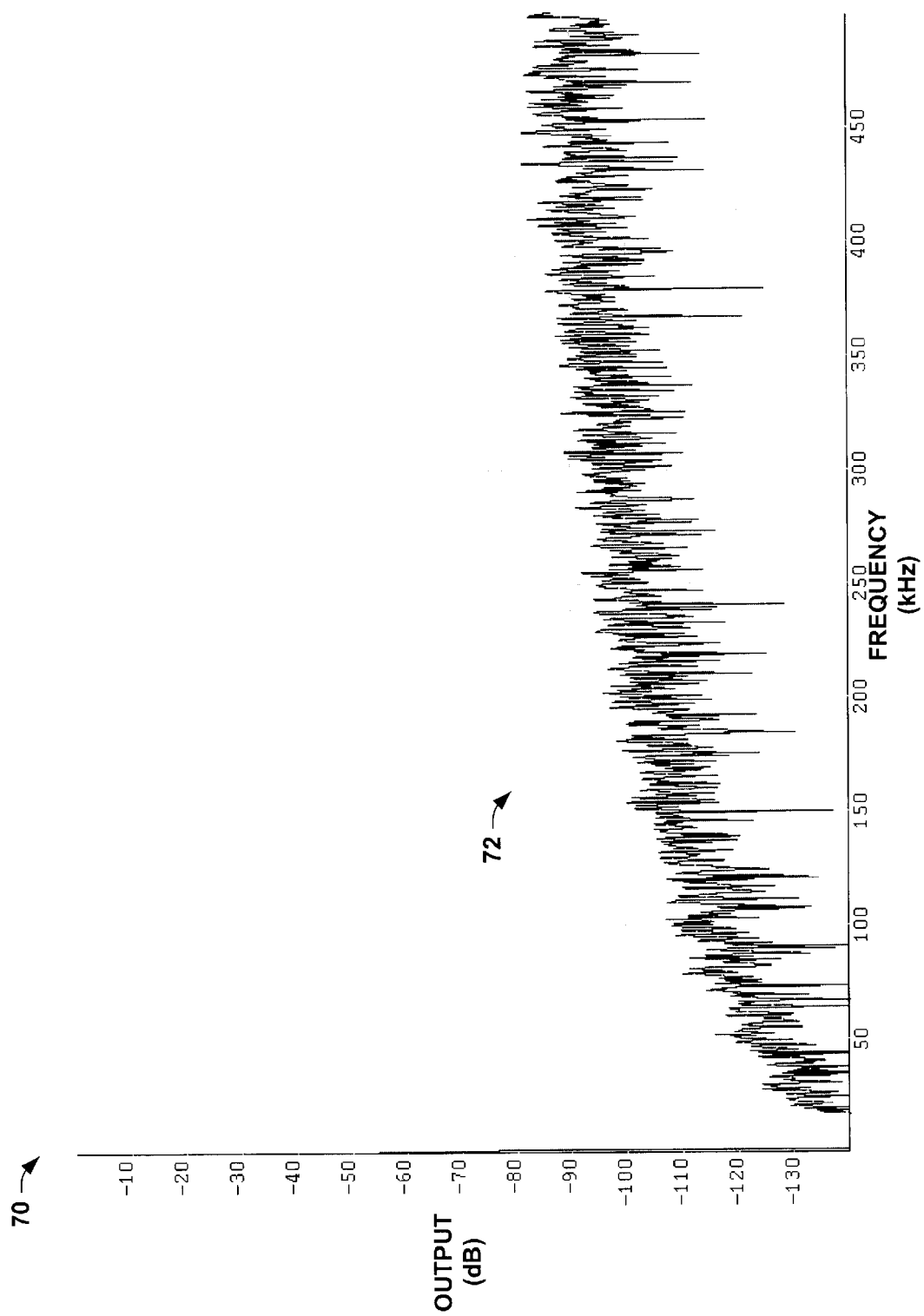
FIG. 7 is a plot illustrating simulation results obtained using the intentional mismatch techniques of the invention with an ILA type DEM algorithm and for a mismatch amount of 0.5% and a tolerance amount of about 0.1% for the second order sigma delta modulator having 4-element D/A converters.

FIGS. 6 and 7 illustrate exemplary performance improvements which may be achieved using the various aspects of the present invention, wherein a 1 mV DC input signal $V_{IN}$ is applied to the exemplary modulator 2. FIG. 6 provides a plot 60 of output (dB) vs. frequency (kHz) illustrating simulation results obtained with no intentional mismatching with an ILA type DEM algorithm and for a mismatch amount of 0.5% with no DEM algorithm, using a tolerance amount of about 0.1% for a second order sigma delta modulator having 4 capacitor D/A converters. In FIG. 6, a sharp peak 62 is found at slightly less than 100 kHz with the ILA algorithm turned off (e.g., no dynamic element matching), with a 0.5% mismatch. The higher frequencies of the plot 60 illustrate the case of no mismatch with the ILA algorithm turned on (e.g., dynamic element matching used), wherein undesired tones 64 are found at roughly 50 kHz intervals. FIG. 7 shows a plot 70 illustrating simulated output (dB) vs. frequency (kHz) results obtained using the intentional mismatch techniques of the invention with an ILA type DEM algorithm and for a mismatch amount of 0.5% and a tolerance amount of about 0.1% in the exemplary modulator 2. The plot 70 in FIG. 7, illustrates employment of the present invention in the modulator 2 with a 1 mV input signal $V_{IN}$. As can be seen in FIG. 7, the output curve 72 shows significant tone reduction (e.g., tones under the noise floor) compared with the tones 64 in FIG. 6.

Figure 8:
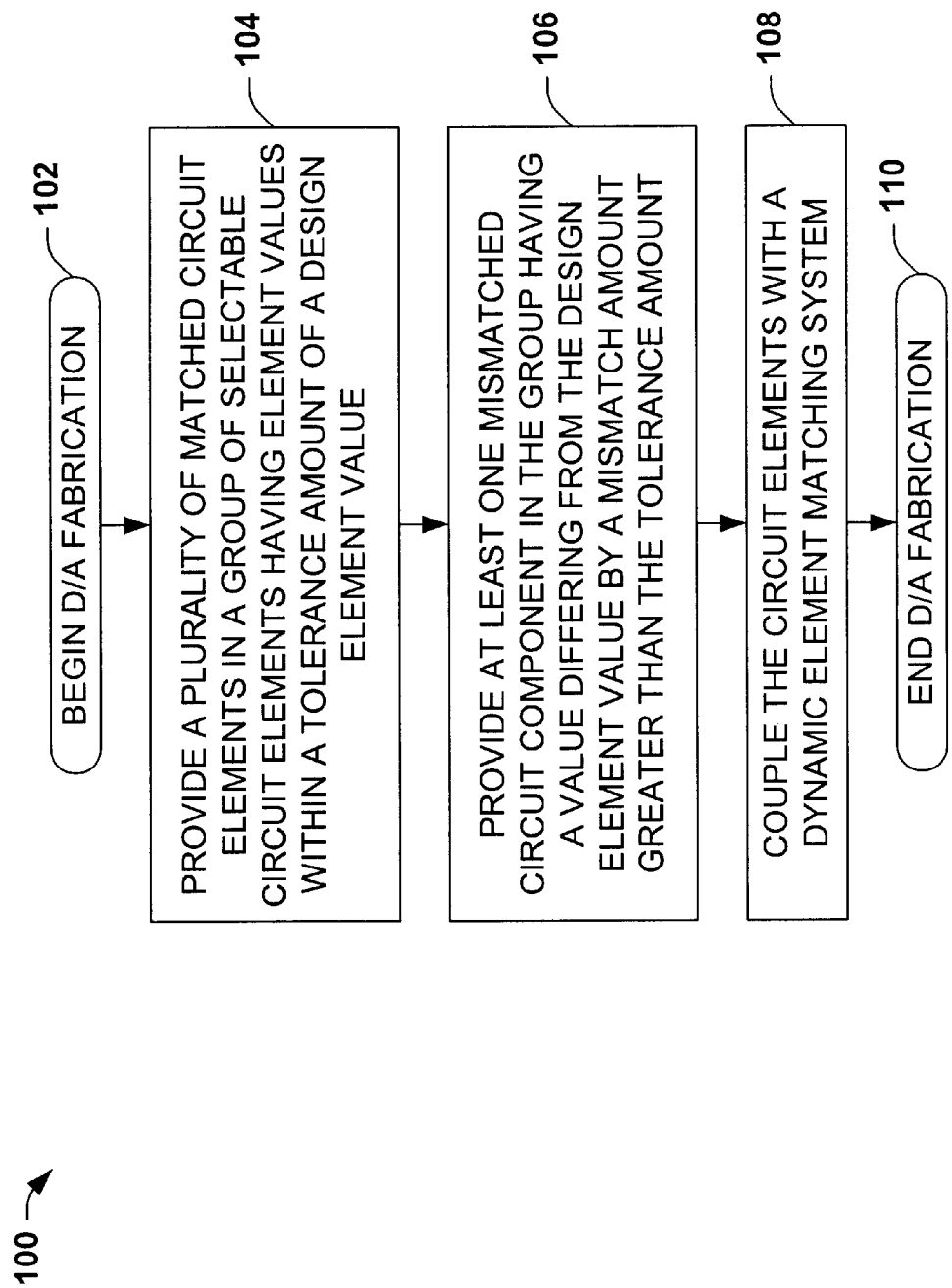
FIG. 8 is a flow diagram illustrating an exemplary method of fabricating a digital to analog converter in accordance with another aspect of the invention.

An exemplary method 100 is illustrated in FIG. 8 for fabricating a D/A converter for providing an analog feedback signal corresponding to a quantized output signal using a group of circuit elements selected according to the quantized output signal in a sigma delta modulator in accordance with another aspect of the invention. Although the exemplary method 100 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication and/or processing of the sigma delta modulators and D/A converters therefor which are illustrated and described herein as well as in association with other structures and devices not illustrated.

Beginning at 102, the method 100 comprises providing a plurality of matched circuit elements at 104 in a group (e.g., the plurality 32 of elements E in FIG. 1 above), where the matched circuit elements have element values within a tolerance amount of a design element value. At 106, one or more mismatched circuit elements are provided in the group (e.g., E' above), where the mismatched circuit element has a mismatched element value differing from the design element value by a mismatch amount, and where the mismatch amount is greater than the tolerance amount. The matched and mismatched circuit elements are then coupled with a DEM system (e.g., system 30 above) at 108, where the DEM system functions during D/A operation to vary the selection of circuit elements of the group, and the method 100 ends at 110.

In one example where the circuit elements in the group are capacitors, the matched elements may be provided at 104 by providing a plurality of matched capacitors (e.g., $Ci_{ACTUAL}$ in FIG. 4A above) having capacitance values within the tolerance amount of a design capacitance value. First and second conductive routing structures (e.g., structures 40a and 40b in FIG. 4A above) are provided at 104 for electrically coupling the matched capacitors with other components in the converter. In this example, the provision of the matched elements at 104 also comprises spacing the conductive routing structures of the individual matched capacitors from one another so as to provide a match capacitance (e.g., CiL in FIG. 4B) in parallel with the matched capacitor, wherein the match capacitance has a value of about the tolerance amount or less.

One or more mismatched capacitor elements may be provided at 106 by providing at least one capacitor (e.g., $C1_{ACTUAL}$ in FIG. 5A) having a capacitance value within the tolerance amount of the design capacitance value, and providing first and second conductive routing structures (e.g., structures 50a and 50b above) for coupling the capacitor with other components. The routing structures of this capacitor are spaced from one another so as to provide a mismatch capacitance in parallel with the capacitor, wherein the mismatch capacitance has a value of about the mismatch amount or more. In another example, the provision of the mismatched circuit element at 106 comprises providing a first capacitor having element value within the tolerance amount of the design capacitance value, providing a second capacitor having a value of about the mismatch amount or more, and coupling the first and second capacitors in parallel to form at least one mismatched capacitor.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A sigma delta modulator, comprising:
   a filter receiving an input signal and an analog feedback signal, the filter being adapted to provide a filtered output signal according to the input signal and the analog feedback signal;
   a quantizer coupled with the filter, the quantizer being adapted to provide a quantized output signal according to the filtered output signal;
   a digital to analog converter coupled with the filter, the digital to analog converter comprising a plurality of circuit elements, the individual circuit elements having an associated element value, the digital to analog converter being adapted to provide the analog feedback signal corresponding to the quantized output signal using circuit elements selected according to the quantized output signal, the plurality of circuit elements comprising:
      at least one mismatched circuit element having a mismatched element value differing from a design element value by a mismatch amount, and
      a plurality of matched circuit elements having element values within a tolerance amount of the design element value, the mismatch amount being greater than the tolerance amount; and
   a dynamic element matching system coupled with the digital to analog converter and the quantizer, the dynamic element matching system being adapted to vary the selection of circuit elements of the digital to analog converter.

2. The sigma delta modulator of claim 1, further comprising a digital filter coupled with the quantizer, the digital filter being adapted to reduce undesirable noise in the quantized output signal.

3. The sigma delta modulator of claim 1, wherein the mismatch amount is greater than or equal to three times the tolerance amount.

4. The sigma delta modulator of claim 3, wherein the tolerance amount is proportional to a standard deviation for the design element value.

5. The sigma delta modulator of claim 3, wherein the tolerance amount is about one standard deviation for the design element value.

6. The sigma delta modulator of claim 1, wherein the tolerance amount is about one standard deviation for the design element value.

7. The sigma delta modulator of claim 1, wherein the filter comprises an integrator.

8. The sigma delta modulator of claim 1, wherein the quantizer comprises a multi-bit analog to digital converter.

9. The sigma delta modulator of claim 1, comprising:
   a plurality of filters serially coupled between the input signal and the quantizer; and
   a plurality of digital to analog converters, the individual digital to analog converters being coupled with the quantizer, the dynamic element matching system, and a corresponding one of the plurality of filters;
   wherein the individual digital to analog converters comprise a plurality of circuit elements, the individual circuit elements having an associated element value, the individual digital to analog converters being adapted to provide an analog feedback signal corresponding to the quantized output signal using circuit elements selected according to the quantized output signal, the plurality of circuit elements of individual digital to analog converters comprising:
      at least one mismatched circuit element having a mismatched element value differing from a design element value by a mismatch amount, and
      a plurality of matched circuit elements having element values within a tolerance amount of the design element value, the mismatch amount being greater than the tolerance amount;
   wherein a first filter receives the input signal and a first analog feedback signal from a first analog to digital converter, the first filter being adapted to provide a first filtered output signal according to the input signal and the analog feedback signal;
   wherein remaining filters receive a filtered output signal from a preceding filter and an analog feedback signal from a corresponding digital converter and provide a filtered output to a succeeding filter;
   wherein the quantizer receives a filtered output from a final filter, and provides the quantized output signal corresponding to the input signal; and
   wherein the dynamic element matching system is coupled with the digital to analog converters and with the quantizer, the dynamic element matching system being adapted to vary the selection of circuit elements of the digital to analog converters.

10. The sigma delta modulator of claim 1, wherein the dynamic element matching system is adapted to vary the selection of circuit elements of the digital to analog converter according to an algorithm, and wherein the algorithm is one of individual level averaging (ILA), group level averaging (GLA), and partial data weighted averaging (partial DWA).

11. The sigma delta modulator of claim 1, wherein the circuit elements are capacitors.

12. The sigma delta modulator of claim 11, wherein the individual circuit elements comprise a capacitor having first and second conductive routing structures for electrically coupling the capacitor with other components in the digital to analog converter, wherein the first and second conductive routing structures of the mismatched circuit element are routed close to one another so as to create a mismatch capacitance in parallel with the capacitor of the mismatched circuit element, the mismatch capacitance having a value of about the mismatch amount or more, and wherein the first and second conductive routing structures of the individual matched circuit elements are spaced from one another so as to provide a match capacitance in parallel with the capacitor of the matched circuit element, the match capacitance having a value of about the tolerance amount or less.

13. The digital to analog converter of claim 11, wherein the tolerance amount is about one standard deviation for the design element value.

14. The sigma delta modulator of claim 1, wherein the mismatched circuit element comprises a first circuit element having an element value within the tolerance amount of the design element value and a second circuit element having a value of about the mismatch amount or more.

15. A digital to analog converter for providing an analog feedback signal corresponding to a quantized output signal in a sigma delta modulator, the digital to analog converter comprising:
a plurality of circuit elements, the individual circuit elements having an associated element value, the digital to analog converter being adapted to provide the analog feedback signal using circuit elements selected according to the quantized output signal, the plurality of circuit elements comprising at least one mismatched circuit element having a mismatched element value differing from a design element value by a mismatch amount, and a plurality of matched circuit elements having element values within a tolerance amount of the design element value, the mismatch amount being greater than the tolerance amount.

16. The digital to analog converter of claim 15, wherein the mismatch amount is greater than or equal to three times the tolerance amount.

17. The digital to analog converter of claim 16, wherein the tolerance amount is proportional to a standard deviation for the design element value.

18. The digital to analog converter of claim 16, wherein the tolerance amount is about one standard deviation for the design element value.

19. The digital to analog converter of claim 15, wherein the circuit elements are capacitors.

20. The digital to analog converter of claim 19, wherein the individual circuit elements comprise a capacitor having first and second conductive routing structures for electrically coupling the capacitor with other components in the digital to analog converter, wherein the first and second conductive routing structures of the mismatched circuit element are routed close to one another so as to create a mismatch capacitance in parallel with the capacitor of the mismatched circuit element, the mismatch capacitance having a value of about the mismatch amount or more, wherein the first and second conductive routing structures of the individual matched circuit elements are spaced from one another so as to provide a match capacitance in parallel with the capacitor of the matched circuit element, the match capacitance having a value of about the tolerance amount or less.

21. The digital to analog converter of claim 19, wherein the mismatch amount is greater than or equal to three times the tolerance amount.

22. The digital to analog converter of claim 21, wherein the tolerance amount is proportional to a standard deviation for the design element value.

23. The digital to analog converter of claim 21, wherein the tolerance amount is about one standard deviation for the design element value.

24. The digital to analog converter of claim 14, wherein the mismatched circuit element comprises a first circuit element having an element value within the tolerance amount of the design element value and a second circuit element having a value of about the mismatch amount or more.

25. A method of fabricating a digital to analog converter for providing an analog feedback signal corresponding to a quantized output signal using a group of circuit elements selected according to the quantized output signal in a sigma delta modulator, the method comprising:
providing a plurality of matched circuit elements in the group in a semiconductor device, the matched circuit elements having element values within a tolerance amount of a design element value; and
providing at least one mismatched circuit element in the group, the at least one mismatched circuit element having a mismatched element value differing from the design element value by a mismatch amount, the mismatch amount being greater than the tolerance amount.

26. The method of claim 25, further comprising coupling the matched circuit elements and the at least one mismatched circuit element with a dynamic element matching system adapted to vary the selection of circuit elements of the group.

27. The method of claim 25:
wherein the circuit elements in the group are capacitors;
wherein providing the plurality of matched circuit elements comprises:
providing a plurality of matched capacitors having capacitance values within the tolerance amount of a design capacitance value;
individually providing first and second conductive routing structures for electrically coupling the matched capacitors with other components in the digital to analog converter; and
spacing the first and second conductive routing structures of the individual matched capacitors from one another so as to provide a match capacitance in parallel with the matched capacitor, the match capacitance having a value of about the tolerance amount or less; and wherein providing the at least one mismatched circuit element comprises:
providing at least one capacitor having a capacitance value within the tolerance amount of the design capacitance value;
providing first and second conductive routing structures for electrically coupling the at least one capacitor with other components in the digital to analog converter; and
spacing the first and second conductive routing structures of the at least one capacitor from one another so as to provide a mismatch capacitance in parallel with the at least one capacitor, the mismatch capacitance having a value of about the mismatch amount or more.

28. The method of claim 25, wherein the circuit elements in the group are capacitors, wherein the matched circuit elements are capacitors having capacitance values within a tolerance amount of a design capacitance value, and wherein providing the at least one mismatched circuit element comprises:

providing a first capacitor having element value within the tolerance amount of the design capacitance value;

providing a second capacitor having a value of about the mismatch amount or more; and coupling the first and second capacitors in parallel to form at least one mismatched capacitor.

* * * * *